United States Patent
Park et al.

(10) Patent No.: US 8,367,502 B2
(45) Date of Patent: Feb. 5, 2013

(54) METHOD OF MANUFACTURING DUAL GATE SEMICONDUCTOR DEVICE

(75) Inventors: Hong-bae Park, Seoul (KR); Hag-ju Cho, Hwaseong-si (KR); Sug-hun Hong, Yongin-si (KR); Sang-jin Hyun, Suwon-si (KR); Hoon-joo Nah, Hwaseong-si (KR); Hyung-seok Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 330 days.

(21) Appl. No.: 12/654,337

(22) Filed: Dec. 17, 2009

(65) Prior Publication Data

US 2010/0164009 A1    Jul. 1, 2010

(30) Foreign Application Priority Data

Dec. 31, 2008    (KR) .......................... 10-2008-0138534

(51) Int. Cl.
*H01L 21/8234*    (2006.01)
(52) U.S. Cl. . 438/275; 438/283; 257/407; 257/E21.637; 257/E21.623
(58) Field of Classification Search ................. 438/157, 438/176, 275, 283, 587, 588, 652, 656, 685; 257/402, 407, 412, 500, E21.637, E21.421, 257/E21.623
See application file for complete search history.

(56) References Cited

U.S. PATENT DOCUMENTS

| | | | |
|---|---|---|---|
| 6,545,324 B2 * | 4/2003 | Madhukar et al. | 257/371 |
| 7,297,588 B2 | 11/2007 | Adetutu | |
| 7,390,719 B2 * | 6/2008 | Jeon et al. | 438/275 |
| 7,759,183 B2 * | 7/2010 | Hu | 438/199 |
| 8,017,484 B2 * | 9/2011 | Luan | 438/287 |

FOREIGN PATENT DOCUMENTS

| | | |
|---|---|---|
| KR | 10-0650698 | 11/2006 |
| KR | 10-0697694 | 2/2007 |

* cited by examiner

*Primary Examiner* — David Vu
(74) *Attorney, Agent, or Firm* — Harness, Dickey & Pierce

(57) ABSTRACT

The method involves providing a semiconductor substrate comprising first and second regions in which different conductive metal-oxide semiconductor (MOS) transistors are to be formed. A gate dielectric layer above the semiconductor substrate sequentially forming a first metallic conductive layer and a second metallic conductive layer on and above the gate dielectric layer; covering the second region with a mask, and performing ion plantation of a first material into the first metallic conductive layer of the first region. Removing the second metallic conductive layer of the first region and forming a first gate electrode of the first region and a second gate electrode of the second region by patterning the gate dielectric layer and the first metallic conductive layer of the first region, and the gate dielectric layer, the first metallic conductive layer, and the second metallic conductive layer of the second region. The first and second regions of the semiconductor substrate having different work functions because the gate electrodes of the first and second regions have different thicknesses and at least one of the first and second gate electrodes include impurities.

14 Claims, 5 Drawing Sheets

METHOD OF MANUFACTURING DUAL GATE SEMICONDUCTOR DEVICE

CROSS-REFERENCE TO RELATED APPLICATIONS

This application claims the benefit of Korean Patent Application No. 10-2008-0138534, filed on Dec. 31, 2008, in the Korean Intellectual Property Office, the disclosure of which is incorporated herein in its entirety by reference.

BACKGROUND

Example embodiments relate to a method of manufacturing a semiconductor device, and more particularly, to a method of manufacturing a semiconductor device having a dual gate.

According to the size reduction of a semiconductor device, a gate electrode of a metal-oxide semiconductor (MOS) transistor may be formed of a metal to increase a speed of the semiconductor device. This is because a metal such as tungsten has a very low resistance compared to that of polysilicon and silicide.

Also, according to the size reduction of a semiconductor device, a gate oxide layer for a MOS transistor is very thin so that a high-k dielectric layer instead of a silicon oxide layer may be used.

Meanwhile, in order to separately adjust threshold voltages of both an n-type metal-oxide semiconductor (NMOS) transistor and a p-type metal-oxide semiconductor (PMOS) transistor of a complementary MOS field effect transistor (CMOSFET), it is desired to independently control the work functions of materials forming gate electrodes of the NMOS and PMOS transistors.

For the independent control of the work functions, gates of the NMOS and PMOS transistors may be formed of materials having different work functions. However, in this case, a mask process is additionally required, and a high-k dielectric characteristic of a gate dielectric layer may be degraded since the gate dielectric layer may be damaged in a gate etching process.

SUMMARY

According to an aspect of an embodiment, there is provided a method of manufacturing a dual gate semiconductor device. The method includes the operations of providing a semiconductor substrate including first and second regions in which different conductive MOS (metal-oxide semiconductor) transistors are to be formed; forming a gate dielectric layer above the semiconductor substrate. The semiconductor substrate further including, sequentially forming a first metallic conductive layer and a second metallic conductive layer on and above the gate dielectric layer; covering the second region with a mask, and performing ion plantation of a first material into the first metallic conductive layer of the first region; removing the second metallic conductive layer of the first region. The semiconductor substrate also includes forming a first gate electrode of the first region and a second gate electrode of the second region by patterning the gate dielectric layer and the first metallic conductive layer of the first region, and the gate dielectric layer, the first metallic conductive layer, and the second metallic conductive layer of the second region.

The first region may be a region in which an n-type metal-oxide semiconductor (NMOS) transistor is to be formed. The second region may be a region in which a p-type metal-oxide semiconductor (PMOS) transistor is to be formed.

The gate dielectric layer may include a material selected from the group consisting of HfO2, HfSiO, HfON, HfSiON, ZrO2, ZrON, ZrSiO2, ZrSiON, and TiO2.

The first metallic conductive layer may have a thickness between 1 through 5 nm.

The second metallic conductive layer may have a thickness between 5 through 50 nm.

The first metallic conductive layer may include a material selected from the group consisting of Ti, Ta, W, Hf, Mo, nitrides of theses, carbides of theses, silicides of theses, and silicide nitrides of theses.

The second metallic conductive layer may be formed of a material different from that of the first metallic conductive layer and may include a material selected from the group consisting of Pt, Ru, IrO, RuO, metal aluminum, and metal aluminum nitride as well as Ti, Ta, W, Hf, Mo, nitrides of theses, carbides of theses, silicides of theses, and silicide nitrides of theses.

The first material may include As.

Before the operation of forming the first metallic conductive layer on the gate dielectric layer, the method may further include the operation of forming a first capping layer on the gate dielectric layer in the first region, and forming a second capping layer on the gate dielectric layer in the second region.

The first capping layer may include a material selected from the group consisting of LaO, GdO, DyO, ErO, SrO, and BaO, and the second capping layer may include Al or AlO.

According to another embodiment, there is provided a method for forming a dual gate semiconductor device. The method of forming the dual gate semiconductor device includes forming a first transistor structure and a second transistor structure having different work functions. The work functions are different because the gate electrodes of the first and second structures may have different thickness. Also, the work functions are different because at least the first or second gate electrodes may include impurities, such as an n-type impurity may be injected into the gate electrode of the first transistor structure.

The first transistor structure may be a NMOS transistor and the second transistor structure may be a PMOS transistor.

The gate electrode of the first transistor structure may be thinner than the gate electrode of the second transistor structure to decrease the work function of the gate electrode. The gate electrode of the second transistor structure may be thicker than the gate electrode of the first transistor structure to increase the work function of the gate electrode of the second transistor structure.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXAMPLE EMBODIMENTS

Figure 1A:
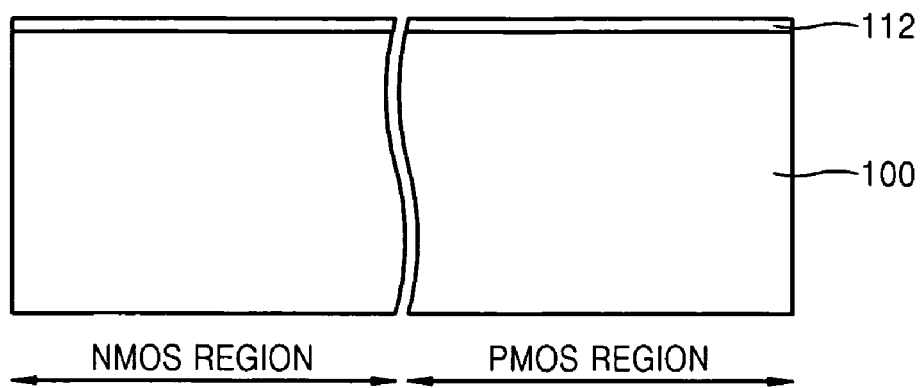
FIGS. 1A through 1E are cross-sectional diagrams describing a method of manufacturing a dual gate semiconductor device according to an embodiment.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

FIGS. 1A through 1E are cross-sectional diagrams for describing a method of manufacturing a dual gate semiconductor device according to an embodiment Referring to FIG. 1A, a semiconductor substrate 100 has formed thereon an n-type metal-oxide semiconductor (NMOS) region whereon an NMOS transistor is to be formed and a p-type metal-oxide semiconductor (PMOS) region whereon a PMOS transistor is to be formed. To be more specific, the NMOS region may be defined by a p-type well, and the PMOS region may be defined by an n-type well.

A gate dielectric layer 112 having a high-k may be formed above the semiconductor substrate 100. The gate dielectric layer 112 may be formed by atomic layer deposition (ALD) using a material selected from the group consisting of HfO2, HfSiO, HfON, HfSiON, ZrO2, ZrON, ZrSiO2, ZrSiON, and TiO2.

Alternatively, an interface layer (not shown) may be formed between the semiconductor substrate 100 and the gate dielectric layer 112. The interface layer forms an interface between the semiconductor substrate 100 and the gate dielectric layer 112 having the high-k, and may be a silicon oxide layer.

Figure 1B:
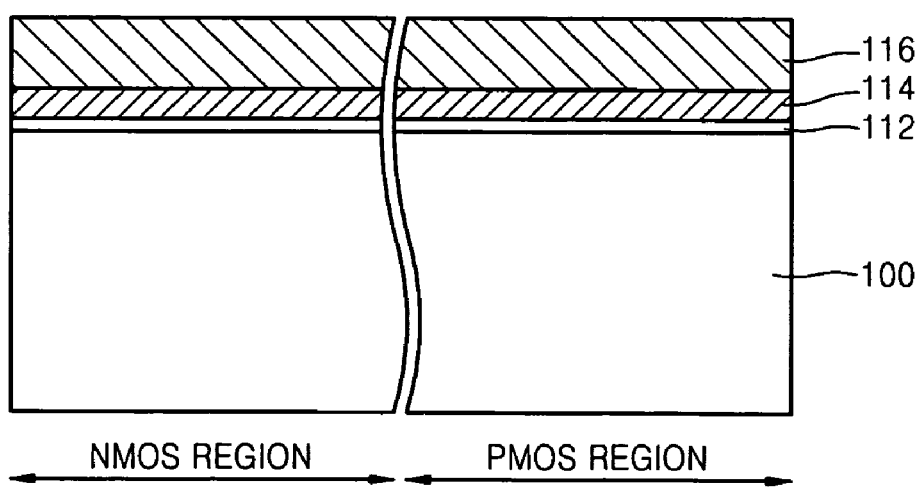

Referring to FIG. 1B, a first metallic conductive layer 114 and a second metallic conductive layer 116 are sequentially formed on and above the gate dielectric layer 112.

The first metallic conductive layer 114 may be formed of a material selected from the group consisting of Ti, Ta, W, Hf, Mo, nitrides thereof such as TiN, TaN, WN, HfN, MO2N, carbides thereof such as TiC, TaC, WC, HfC, Mo2C, silicides thereof such as TiSi2, WSi2, TaSi2, HfSi2, MoSi2, and silicide nitrides thereof such as TiSiN, WSiN, TaSiN, HfSiN, MoSiN. The first metallic conductive layer 114 may have a thickness between 1 through 5 nm.

The second metallic conductive layer 116 may be formed of a material selected from the group consisting of Pt, Ru, IrO, RuO, metal aluminum, and metal aluminum nitride, as well as Ti, Ta, W, Hf, Mo, nitrides thereof such as TiN, TaN, WN, HfN, MO2N, carbides thereof such as TiC, TaC, WC, HfC, Mo2C, silicides thereof such as TiSi2, WSi2, TaSi2, HfSi2, MoSi2, and silicide nitrides thereof such as TiSiN, WSiN, TaSiN, HfSiN, MoSiN. The second metallic conductive layer 116 may have a thickness equal to or greater than 5 nm. For example the second metallic conductive layer 116 may have a thickness between 5 through 50 nm.

The second metallic conductive layer 116 and the first metallic conductive layer 114 may be formed using different materials. For example, the first metallic conductive layer 114 may be formed of TiN and the second metallic conductive layer 116 may be formed of TaN.

The first metallic conductive layer 114 and the second metallic conductive layer 116 may be formed by chemical vapor deposition (CVD) or physical vapor deposition (PVD).

Figure 1C:
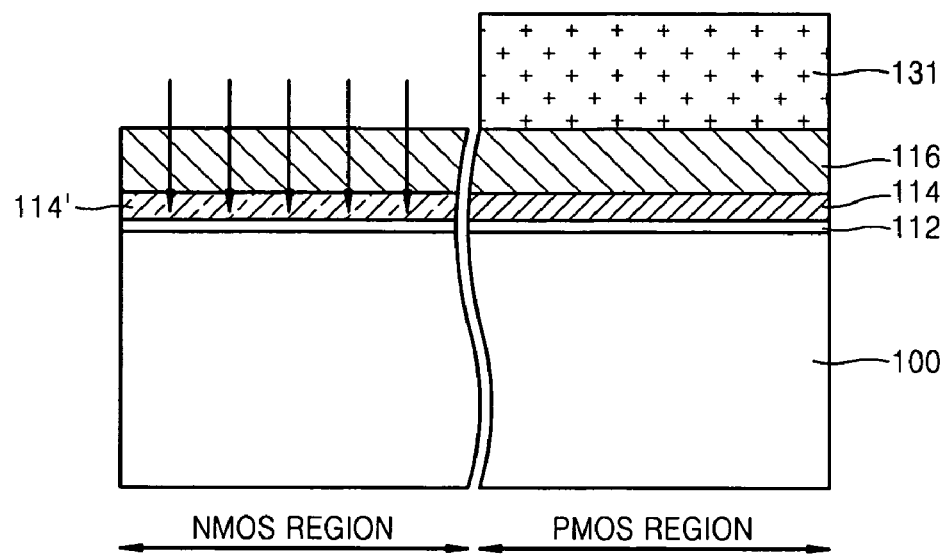

Referring to FIG. 1C, the PMOS region may be covered with a mask layer 131 and an n-type impurity is injected into the first metallic conductive layer 114 of the NMOS region. The n-type impurity may be injected by ion implantation or plasma doping. The n-type impurity may include As. The mask layer 131 may include photoresist.

Since the first metallic conductive layer 114 is very thin, if the second metallic conductive layer 116 is not arranged on the first metallic conductive layer 114, ions (an embodiment describes using As, but other nitrates may be used as well) injected may pass through the first metallic conductive layer 114 and be injected into an active region of the semiconductor substrate 100. If so, the n-type impurity injected into the active region of the semiconductor substrate 100 may degrade a characteristic of a semiconductor device.

According to the present embodiment, since the second metallic conductive layer 116 having the large thickness is arranged on the first metallic conductive layer 114, the first metallic conductive layer 114 may have an appropriate concentration profile of ions when ions are passed through the second metallic conductive layer 116 and then injected into the first metallic conductive layer 114.

Figure 1D:
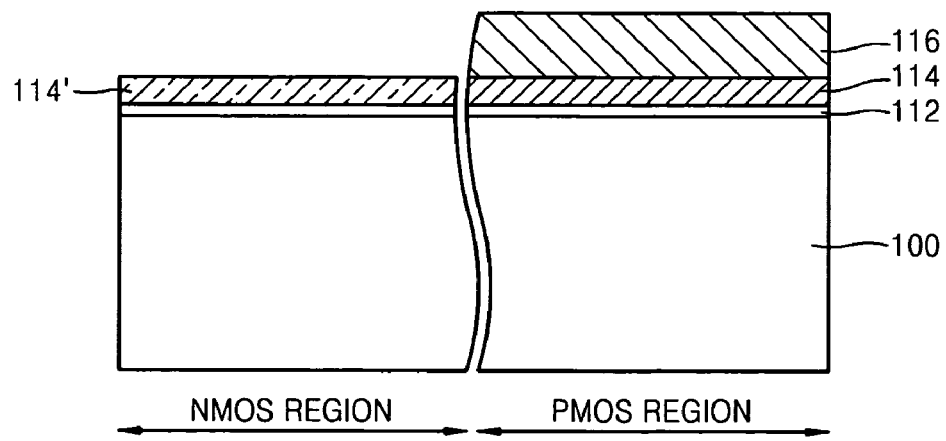

Referring to FIG. 1D, the second metallic conductive layer 116 of the NMOS region is removed. The second metallic conductive layer 116 may be removed by dry etching or wet etching. At this time, the mask layer 131 used for the n-type impurity injection may be used as an etching mask. After that, the mask layer 131 is removed.

In this manner, a first metallic conductive layer 114' including As is formed on the gate dielectric layer 112 in the NMOS region and the first metallic conductive layer 114 without including As and the second metallic conductive layer 116 are sequentially formed on the gate dielectric layer 112 in the PMOS region.

Figure 1E:
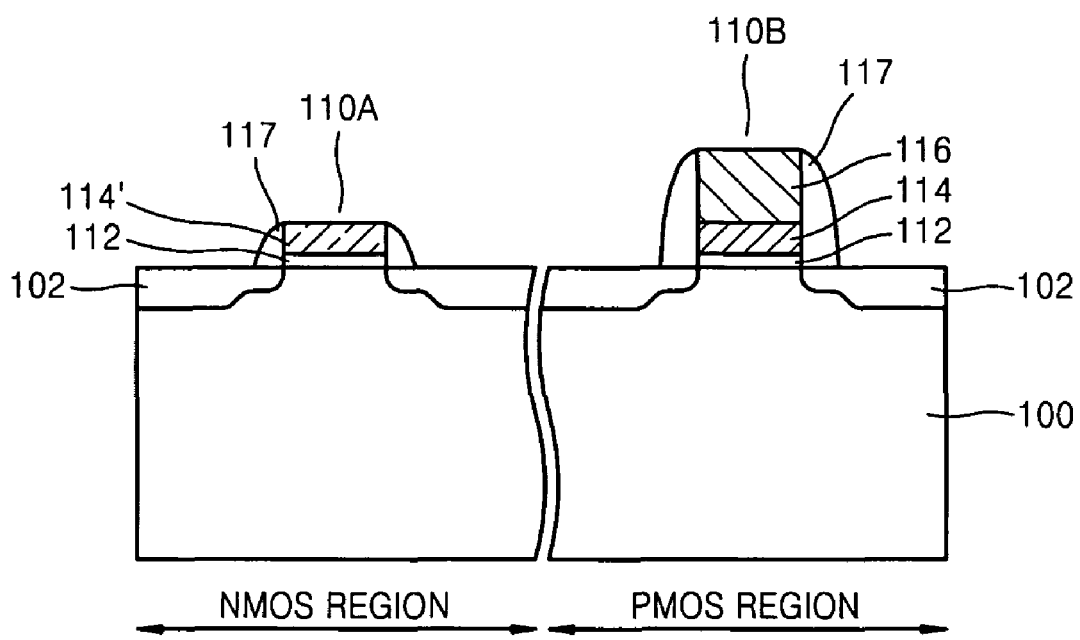

Referring to FIG. 1E, the first metallic conductive layers 114 and 114', and the second metallic conductive layer 116 are patterned to form a first gate electrode 114' of the NMOS region and second gate electrodes 118 of the PMOS region. Then, an insulating layer may be used as a spacer deposited and etched back above the semiconductor substrate 100. Whereon, the first gate electrode 114' and the second gate electrodes 118 are formed, so that a gate spacer 117 is formed on sidewalls of the first gate electrode 114' and the second gate electrodes 118.

Alternatively, a hardmask layer (not shown) may be further formed on the first metallic conductive layer 114' and the second metallic conductive layer 116. Then the hard mask layer, the first metallic conductive layers 114 and 114' and the second metallic conductive layer 116 may be patterned to form the first gate electrode 114' of the NMOS region and the second gate electrodes 118 of the PMOS region. At this time, the hardmask layer is formed on the first gate electrode 114' and the second gate electrodes 118, and the gate spacer 117 is also formed on a sidewall of the hardmask layer.

A source/drain region 102 is formed in the semiconductor substrate 100 in such a manner that the source/drain region 102 may be formed at both sides of the first gate electrode 114' and the second gate electrodes 118. The source/drain region 102 may have a lightly doped drain (LDD) structure.

In general, in an NMOS transistor, a threshold voltage is proportional to the work function of a gate electrode material, but in a PMOS transistor, a threshold voltage is inversely proportional to the work function of a gate electrode material.

According to the present embodiment, in order to separately control the work functions of a PMOS transistor and an NMOS transistor, gate electrodes of the PMOS and NMOS regions have different thicknesses and an n-type impurity is injected into a gate electrode material of the NMOS region.

To be more specific, in order to decrease the work function of the gate electrode of the NMOS transistor, the gate electrode of the NMOS transistor is formed to be relatively thin and ions are injected into the gate electrode of the NMOS transistor. In order to increase the work function of the gate electrode of the PMOS transistor, the gate electrode of the PMOS transistor is formed to be relatively thick.

A threshold voltage of the NMOS transistor is affected by the concentration profile of the n-type impurity in the gate electrode. According to the present embodiment, the second metallic conductive layer 116, being formed relatively thick and being formed of, for example, TaN, may be formed on the first metallic conductive layer 114, being formed relatively thin and being formed of, for example, TiN. After that, ions are injected into the second metallic conductive layer 116 and the first metallic conductive layer 114 of the NMOS region. Then, the second metallic conductive layer 116 of the NMOS region may be removed to form a gate electrode that is relatively thin and formed of the first metallic conductive layer 114' including ions in the NMOS region and to form a gate electrode that is relatively thin and formed of the first metallic conductive layer 114 and the second metallic conductive layer 116, without including ions, in the PMOS region.

Figure 2A:
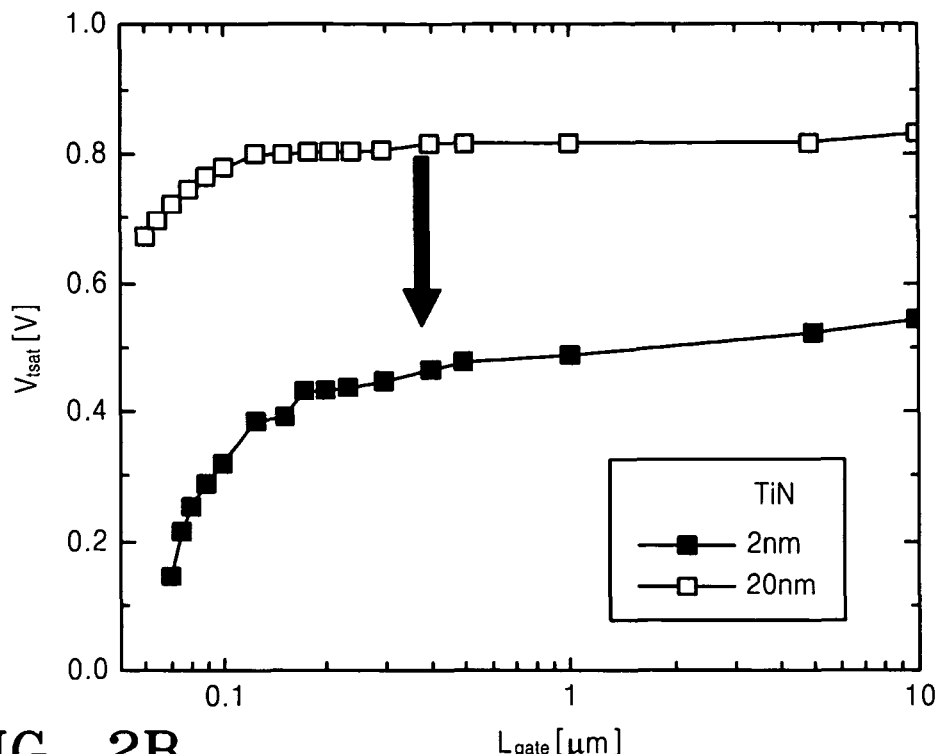
FIGS. 2A and 2B are diagrams of variation of a threshold voltage with respect to a thickness of a gate electrode of an NMOS transistor.
Figure 2B:
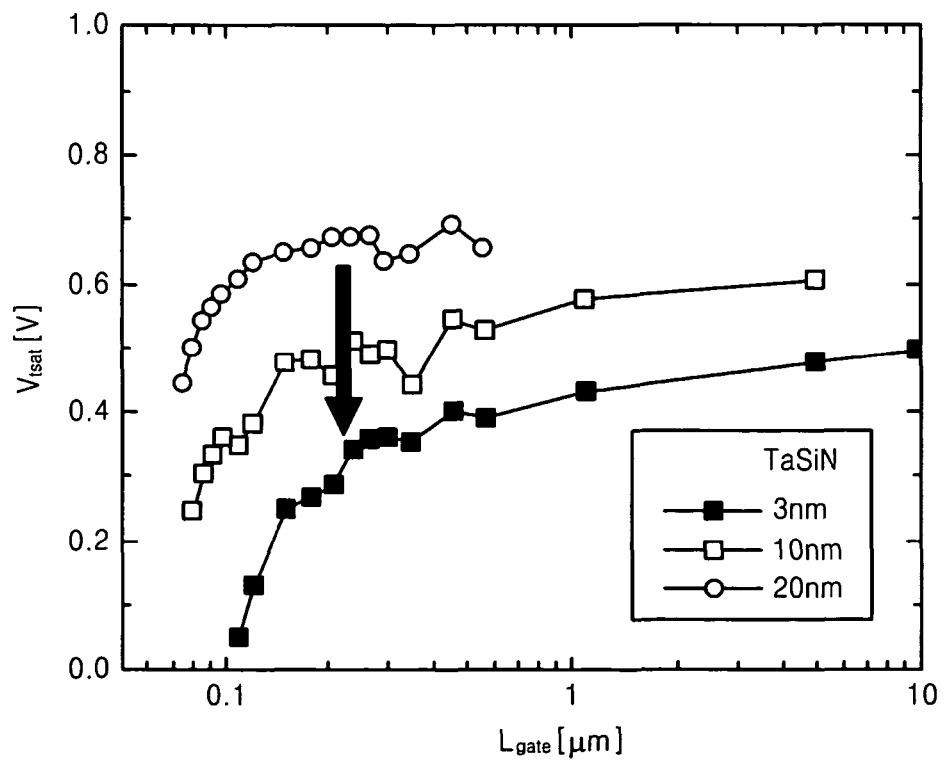

FIGS. 2A and 2B are diagrams of variation of a threshold voltage with respect to the thickness of a gate electrode of an NMOS transistor.

Referring to FIG. 2A, when the thickness of a gate electrode that is formed of TiN is decreased from 20 nm to 2 nm, the threshold voltage may be decreased by about 300 mV from about 0.8 V to about 0.5 V. Also, referring to FIG. 2B, when the thickness of a gate electrode that is formed of TaSiN is decreased from 20 nm to 10 nm and then to 3 nm, the threshold voltage may be decreased by about 300 mV.

Referring to FIGS. 2A and 2B, when the gate electrode of the NMOS transistor is formed of TiN or TaSiN, the threshold voltage may be decreased by decreasing the thickness of the gate electrode.

Figure 3A:
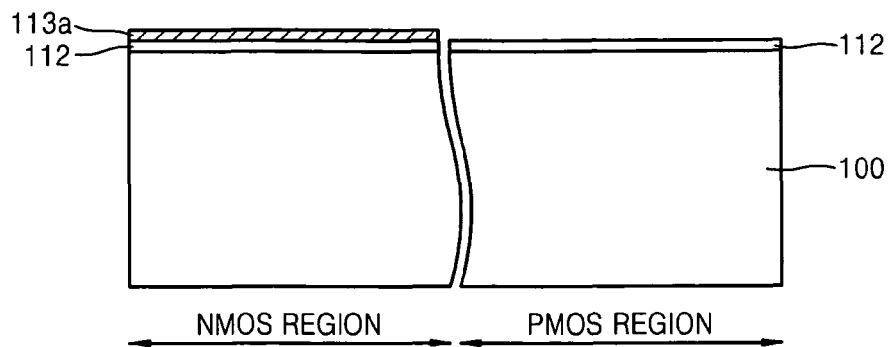
FIGS. 3A through 3C are cross-sectional diagrams describing a method of manufacturing a dual gate semiconductor device according to another embodiment.
Figure 3B:
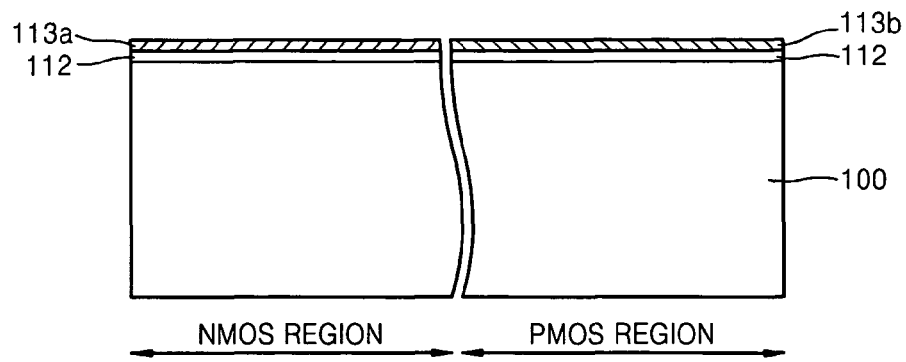
Figure 3C:
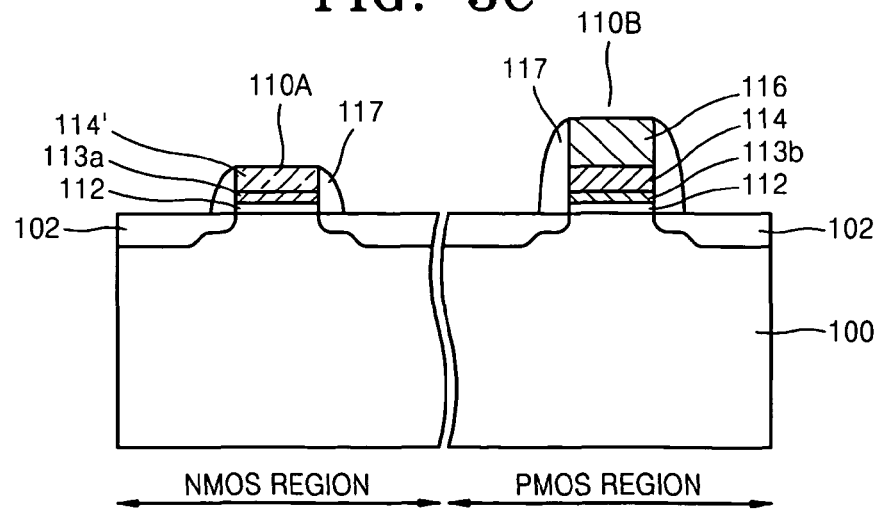

FIGS. 3A through 3C are cross-sectional diagrams for describing a method of manufacturing a dual gate semiconductor device according to another embodiment. The method according to the present embodiment with reference to FIGS. 3A through 3C is different from the method according to the previous embodiment with reference to FIGS. 1A through 1E in that the method according to the present embodiment involves forming a capping layer on the gate dielectric layer 112. Thus, the method according to the present embodiment is described only with reference to forming the gate dielectric layer 112 and the capping layer on the semiconductor substrate 100.

Forming the gate dielectric layer 112 on the semiconductor substrate 100 according to the present embodiment is the same as the aforementioned described with reference to FIG. 1A.

Referring to FIG. 3A, a first capping layer 113a may be formed on the gate dielectric layer 112. The first capping layer 113a may be formed by ALD using an Oxide. For example the first capping layer 113a may be formed of LaO, GdO, DyO, ErO, SrO, or BaO. After that, the first capping layer 113a in an NMOS region is covered with a mask layer such as a photoresist layer and then the first capping layer 113a in a PMOS region is removed to leave the first capping layer 113a only in the NMOS region.

Referring to FIG. 3B, a second capping layer 113b may be formed on and above the gate dielectric layer 112 and the first capping layer 113a. The second capping layer 113b may be formed by ALD using a metal or a metal oxide. For example the second capping layer 113b may be formed by using Al or AlO. After that, the second capping layer 113b in the NMOS region may be removed to leave the second capping layer 113b only in the PMOS region.

FIG. 3C is a diagram of a product result obtained by forming the first capping layer 113a in the NMOS region, forming the second capping layer 113b in the PMOS region, and then forming gate electrodes according to the aforementioned contents described with reference to FIGS. 1B through 1E.

The first capping layer 113a may prevent an n-type impurity injected into the first gate electrode 114' of the NMOS region from diffusing into the gate dielectric layer 112 or an active region of the semiconductor substrate 100. Meanwhile, a threshold voltage of a gate electrode of an NMOS transistor may be decreased by a dipole that is in the gate dielectric layer 112 by forming the first capping layer 113a with a material having high electron affinity, such as LaO, to the gate dielectric layer 112.

A threshold voltage of a gate electrode of a PMOS transistor may be decreased by a dipole that is opposite to the dipole of the NMOS region and that is in the gate dielectric layer 112 by forming the second capping layer 113b with a material having low electron affinity, such as AlO, to the gate dielectric layer 112.

According to the present embodiment, a dual capping layer is formed by using different materials to form the first and second capping layers 113a and 113b of the NMOS region and the PMOS region. However, capping layers formed of the same material may be applied to the NMOS region and the PMOS region.

While embodiments have been particularly shown and described with reference to exemplary embodiments thereof, it will be understood that various changes in form and details may be made therein without departing from the spirit and scope of the following claims.

What is claimed is:

1. A method of manufacturing a dual gate semiconductor device, the method comprising:
   providing a semiconductor substrate having first and second regions in which different conductive MOS (metal-oxide semiconductor) transistors are to be formed;
   forming a gate dielectric layer over the semiconductor substrate;
   sequentially forming a first metallic conductive layer and a second metallic conductive layer over the gate dielectric layer;
   covering the second region with a mask;
   performing ion plantation of a first material into the first metallic conductive layer over the first region;
   removing the second metallic conductive layer over the first region; and
   forming a first gate electrode over the first region and a second gate electrode over the second region by patterning the gate dielectric layer and the first metallic conductive layer of the first region, and the gate dielectric layer, the first metallic conductive layer, and the second metallic conductive layer of the second region.

2. The method of claim 1, wherein the first region is a region in which an NMOS (n-type metal-oxide semiconductor) transistor is formed and the second region is a region in which a PMOS (p-type metal-oxide semiconductor) transistor is formed.

3. The method of claim 1, wherein the gate dielectric layer comprises a material selected from the group consisting of $HfO_2$, HfSiO, HfON, HfSiON, $ZrO_2$, ZrON, $ZrSiO_2$, ZrSiON, and TiO.

4. The method of claim 1, wherein the first metallic conductive layer has a thickness between 1 through 5 nm.

5. The method of claim 1, wherein the second metallic conductive layer has a thickness between 5 through 50 nm.

6. The method of claim 1, wherein the second metallic conductive layer has a thickness greater than 5 nm.

7. The method of claim 1, wherein the first metallic conductive layer comprises a material selected from the group consisting of Ti, Ta, W, Hf, Mo, nitrides of these, carbides of these, silicides of these, and silicide nitrides of these.

8. The method of claim 1, wherein the second metallic conductive layer is formed of a material different from that of the first metallic conductive layer.

9. The method of claim 1, wherein the second metallic conductive layer comprises a material selected from the group consisting of Pt, Ru, IrO, RuO, metal aluminum, and metal aluminum nitride, as well as Ti, Ta, W, Hf, Mo, nitrides of these, carbides of these, silicides of these, and silicide nitrides of these.

10. The method of claim 1, wherein the first material comprises As.

11. The method of claim 1, wherein, before sequentially forming the first metallic conductive layer and the second metallic conductive layer, the method further comprising:
    forming a first capping layer on the gate dielectric layer over the first region; and
    forming a second capping layer over the gate dielectric layer in the second region.

12. The method of claim 11, wherein the first capping layer comprises a material selected from the group consisting of LaO, GdO, DyO, ErO, SrO, and BaO.

13. The method of claim 11, wherein the second capping layer comprises Al or AlO.

14. The method of claim 11, wherein the second capping layer comprises a material different from that of the first capping layer.

* * * * *